United States Patent
Wang et al.

(10) Patent No.: US 8,586,481 B2
(45) Date of Patent: Nov. 19, 2013

(54) CHEMICAL PLANARIZATION OF COPPER WAFER POLISHING

(75) Inventors: You Wang, Cupertino, CA (US); Wen-Chiang Tu, Mountain View, CA (US); Feng Q. Liu, San Jose, CA (US); Yuchun Wang, Santa Clara, CA (US); Lakshmanan Karuppiah, San Jose, CA (US); William H. McClintock, Los Altos, CA (US); Barry L. Chin, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 79 days.

(21) Appl. No.: 13/105,658

(22) Filed: May 11, 2011

(65) Prior Publication Data
US 2011/0294293 A1 Dec. 1, 2011

Related U.S. Application Data

(60) Provisional application No. 61/350,126, filed on Jun. 1, 2010.

(51) Int. Cl.
*H01L 21/302* (2006.01)

(52) U.S. Cl.
USPC ........... 438/692; 438/691; 438/694; 438/754; 216/100; 216/106

(58) Field of Classification Search
USPC ......... 438/691, 692, 693, 694, 657, 747, 754, 438/759; 216/88, 89, 90, 100, 106, 108
See application file for complete search history.

(56) References Cited

U.S. PATENT DOCUMENTS

| | | | |
|---|---|---|---|
| 6,451,697 B1 | 9/2002 | Sun et al. | |
| 6,551,935 B1 | 4/2003 | Sinha et al. | |
| 6,569,349 B1 | 5/2003 | Wang et al. | |
| 6,592,742 B2 | 7/2003 | Sun et al. | |
| 6,670,272 B2 | 12/2003 | Wu et al. | |
| 6,677,239 B2 | 1/2004 | Hsu et al. | |
| 6,830,500 B2 | 12/2004 | Chopra et al. | |
| 6,872,329 B2 | 3/2005 | Wang et al. | |
| 7,063,597 B2 | 6/2006 | Prabhu et al. | |
| 7,104,869 B2 | 9/2006 | Tsai et al. | |
| 7,128,825 B2 | 10/2006 | Liu et al. | |
| 7,232,514 B2 | 6/2007 | Liu et al. | |
| 7,442,646 B2 * | 10/2008 | Kim et al. | 438/691 |
| 7,633,165 B2 | 12/2009 | Hsu et al. | |

(Continued)

OTHER PUBLICATIONS

International Search Report and Written Opinion dated Jan. 19, 2012 for International Application No. PCT/US2011/036019.

*Primary Examiner* — Lan Vinh
(74) *Attorney, Agent, or Firm* — Patterson & Sheridan, LLP (57) ABSTRACT

Embodiments described herein relate to removing material from a substrate. More particularly, the embodiments described herein relate to polishing or planarizing a substrate by a chemical mechanical polishing process. In one embodiment, a method of chemical mechanical polishing (CMP) of a substrate is provided. The method comprises exposing a substrate having a conductive material layer formed thereon to a polishing solution comprising phosphoric acid, one or more chelating agents, one or more corrosion inhibitors, and one or more oxidizers, forming a passivation layer on the conductive material layer, providing relative motion between the substrate and a polishing pad and removing at least a portion of the passivation layer to expose a portion of the underlying conductive material layer, and removing a portion of the exposed conductive material layer.

8 Claims, 5 Drawing Sheets

(56) References Cited

U.S. PATENT DOCUMENTS

| | | |
|---|---|---|
| 7,662,719 B2 | 2/2010 | Sinha et al. |
| 7,683,459 B2 | 3/2010 | Ma et al. |
| 2002/0178169 A1 | 11/2002 | Nair et al. |
| 2002/0192940 A1 | 12/2002 | Lee et al. |
| 2003/0049929 A1 | 3/2003 | Tsuchiya |
| 2003/0234184 A1 | 12/2003 | Liu et al. |
| 2004/0074517 A1 | 4/2004 | Korthuis et al. |
| 2004/0142640 A1 | 7/2004 | Prabhu et al. |
| 2004/0248412 A1 | 12/2004 | Liu et al. |
| 2005/0070110 A1* | 3/2005 | Ohtorii et al. ............... 438/695 |
| 2005/0124165 A1* | 6/2005 | Chuang et al. ............... 438/692 |
| 2006/0175298 A1* | 8/2006 | Zhao et al. .................... 216/88 |
| 2007/0068086 A1* | 3/2007 | Akatsuka ...................... 51/307 |
| 2007/0144915 A1* | 6/2007 | Tian et al. .................... 205/640 |
| 2007/0290166 A1 | 12/2007 | Liu et al. |
| 2008/0257862 A1* | 10/2008 | Belov et al. ................... 216/41 |

* cited by examiner

CHEMICAL PLANARIZATION OF COPPER WAFER POLISHING

CROSS-REFERENCE TO RELATED APPLICATIONS

This application claims benefit of U.S. provisional patent application Ser. No. 61/350,126, filed Jun. 1, 2010, which is herein incorporated by reference in its entirety.

BACKGROUND

1. Field

Embodiments described herein relate to removing material from a substrate. More particularly, the embodiments described herein relate to polishing or planarizing a substrate by a chemical mechanical polishing process.

2. Description of the Related Art

A three-dimensional (3-D) integrated circuit is a single integrated circuit built by stacking silicon substrates and/or dies and interconnecting them vertically so that they behave as a single device. Vias have been used in 3-D integrated circuit fabrication to provide electrical coupling between one or more layers of conductive material. More recently, through-silicon vias (TSV) have arisen as an alternative method to conventional wire bonding. TSV structures allow for shorter interconnects by forming interconnects in the z-axis. The interconnects may be created through a substrate by forming vias extending from a front surface to a back surface of the substrate. After creating the interconnects in the z-axis, multiple substrates can then be stacked on top of one another, and electrically coupled through the vertically extending interconnect. TSV structures provide a means for reducing the footprint of substrates in semiconductor applications.

TSV structures are formed using sequential material deposition and material removal techniques on a substrate surface to form features therein. As layers of materials are sequentially deposited and removed, the uppermost surface of the substrate may become non-planar across its surface and require planarization prior to further processing.

Planarization or "polishing" is a process in which material is removed from the surface of the substrate to form a generally even, planar surface. Planarization is useful in removing excess deposited material, removing undesired surface topography, and surface defects, such as surface roughness, agglomerated materials, crystal lattice damage, scratches, and contaminated layers or materials to provide an even surface for subsequent photolithography and other semiconductor manufacturing processes.

Chemical Mechanical Planarization or Chemical Mechanical Polishing (CMP) is a common technique used to planarize substrates. CMP utilizes a chemical composition, such as slurries or other fluid medium, for selective removal of materials from substrates. In conventional CMP techniques, a substrate carrier or polishing head is mounted on a carrier assembly and positioned in contact with a polishing pad in a CMP apparatus. The carrier assembly provides a controllable pressure to the substrate, thereby pressing the substrate against the polishing pad. The pad is moved relative to the substrate by an external driving force. The CMP apparatus affects polishing or rubbing movements between the surface of the substrate and the polishing pad while dispersing a polishing slurry or solution to affect chemical and mechanical activities and consequential removal of materials from the surface of the substrate.

One objective of CMP is to remove a predictable amount of material at a high removal rate while achieving uniform surface topography both within each substrate and from substrate to substrate when performing a batch polishing process. The high removal rate of material is often achieved through the use of expensive polishing slurries and the application of high polishing pressures to the structure being polished. However, such high polishing pressures may lead to damage of the underlying structure. Further, the use of expensive slurries contributes to an increased cost of ownership.

Therefore, there is a need for a low cost polishing process which accurately and reliably removes a predictable amount of material at low or no pressure while achieving uniform surface topography at higher removal rates.

SUMMARY

Embodiments described herein relate to removing material from a substrate. More particularly, the embodiments described herein relate to polishing or planarzing a substrate by a chemical mechanical polishing process. In one embodiment, a method of chemical mechanical polishing (CMP) of a substrate is provided. The method comprises exposing a substrate having a conductive material layer formed thereon to a polishing solution comprising phosphoric acid, one or more chelating agents, one or more corrosion inhibitors, and one or more oxidizers, forming a passivation layer on the conductive material layer, providing relative motion between the substrate and a polishing pad and removing at least a portion of the passivation layer to expose a portion of the underlying conductive material layer, and removing a portion of the exposed conductive material layer by chemical dissolution.

In another embodiment, a method of chemical mechanical polishing (CMP) of a substrate is provided. The method comprises exposing a substrate having a plurality of vias filled with an excess conductive material in a face-up orientation to a polishing solution, wherein the excess of conductive material has a deposition profile including areas of high overburden and areas of low overburden, the polishing solution comprising phosphoric acid, one or more chelating agents, one or more corrosion inhibitors, and one or more oxidizers, forming a passivation layer on the conductive material, providing relative motion between the substrate and the polishing pad to remove the passivation layer from the areas of high overburden of the conductive material to expose portions of the conductive material while the passivation layer remains over the areas of low overburden, and removing conductive material from the exposed portions of the conductive material while applying a pressure between the substrate and the polishing pad by use of a carrier head assembly, wherein the pressure is less than 0.5 psi.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to removing material from a substrate. More particularly, the embodiments described herein relate to polishing or planarzing a substrate by a chemical mechanical polishing process. In certain embodiments the removal of conductive material from a surface of a substrate is accomplished by chemical reaction and planarization is achieved by balancing the removal rate of conductive material with the passivation dissimilarity between the peaks and valleys of the topography of the conductive material.

In certain embodiments described herein, during the substrate polishing process, the substrate is held face-down by the carrier head assembly at very low polishing pressure or no polishing pressure to create a desired chemical reaction layer between the substrate and the surface of the polishing pad. In certain embodiments described herein the polishing pressure is below 0.5 psi and different carrier head assembly zone pressures may be used for tuning the material removal profile of the substrate.

Embodiments of the polishing processes described herein generally provide for a higher material removal rate than most current processes using current commercial slurries. The high material removal rates achieved using the embodiments described herein are less dependent on traditional polishing parameters such as platen rotation and sweep distance and thus the corresponding hardware footprint may be greatly reduced. For example, in certain embodiments described herein, a smaller platen may be used reducing the platen from 32 inches in diameter to 18 inches in diameter thus reducing the overall cost of ownership.

In one embodiment, an abrasive-free polishing solution is provided. In another embodiment, an abrasive polishing solution is provided. Both polishing solutions comprise an acid, such as phosphoric acid, a chelating agent, such as ammonium citrate, a corrosion inhibitor, and an oxidizer. In certain embodiments, the abrasive-free polishing solution further comprises a surfactant.

In certain embodiments described herein conductive material is removed mainly by chemical reaction between the conductive material and the polishing solution and planarization is based on a passivation-depassivation mechanism where low topography is protected by a passivation layer and higher topography is unprotected leading to higher chemical dissolution and higher removal rates of higher topography areas relative to lower topography. The embodiments described herein differ from traditional CMP processes which generally rely on high down force pressures and mechanical abrasion to achieve high removal rates.

The words and phrases used herein should be given their ordinary and customary meaning in the art by one skilled in the art unless otherwise further defined.

Chemical mechanical polishing ("CMP") as used herein should be broadly construed and includes, but is not limited to, removing a material from a substrate surface by chemical activity (e.g., chemical dissolution), mechanical activity, or a combination of both chemical and mechanical activity without the application of electrochemical activity.

The term "areas of high overburden" as used herein refers to conductive material formed with a greater thickness over narrow feature definitions relative to minimal deposition of conductive material over wide feature definitions.

The term "areas of low overburden" as used herein refers to conductive material formed with a lesser thickness over wide feature definitions relative to conductive material with a greater thickness formed over narrow feature definitions.

The term "conductive material layer" as used herein refers to any conductive material, such as copper, tungsten, aluminum, and/or their alloys used to fill a feature to form lines, contacts or vias.

The term "face-up orientation" as used herein refers to the orientation of a substrate with a conductive material deposited thereon such that the conductive material faces upward.

The term "face-down orientation" as used herein refers to the orientation of a substrate with a conductive material deposited thereon such that the conductive material faces downward.

The terms narrow and wide feature definitions as used herein may vary depending on the structures formed on the surface of the substrate, but can generally be characterized by the respective deposition profiles of excessive material deposition (or high overburden) formed over narrow feature definitions and minimal or low material deposition (minimal or low overburden), over wide feature definitions. For example narrow feature definitions may be less than 1 μm in size and may have a high overburden as compared to wide feature definitions that may be about 3 μm or greater in size and that may have minimal or insufficient overburden.

While the particular apparatus in which the embodiments described herein can be practiced is not limited, it is particularly beneficial to practice the embodiments in a REFLEXION GT™ system, REFLEXION® LK CMP system, and MIRRA MESA® system sold by Applied Materials, Inc., Santa Clara, Calif. Additionally, CMP systems available from other manufacturers may also benefit from embodiments described herein. Embodiments described herein may also be practiced on overhead circular track polishing systems including the overhead track polishing systems described in commonly assigned U.S. patent application Ser. No. 12/420, 996, titled POLISHING SYSTEM HAVING A TRACK, filed Apr. 9, 2009, now published as US 2009/0258574, which is hereby incorporated by reference in its entirety.

Figure 1:
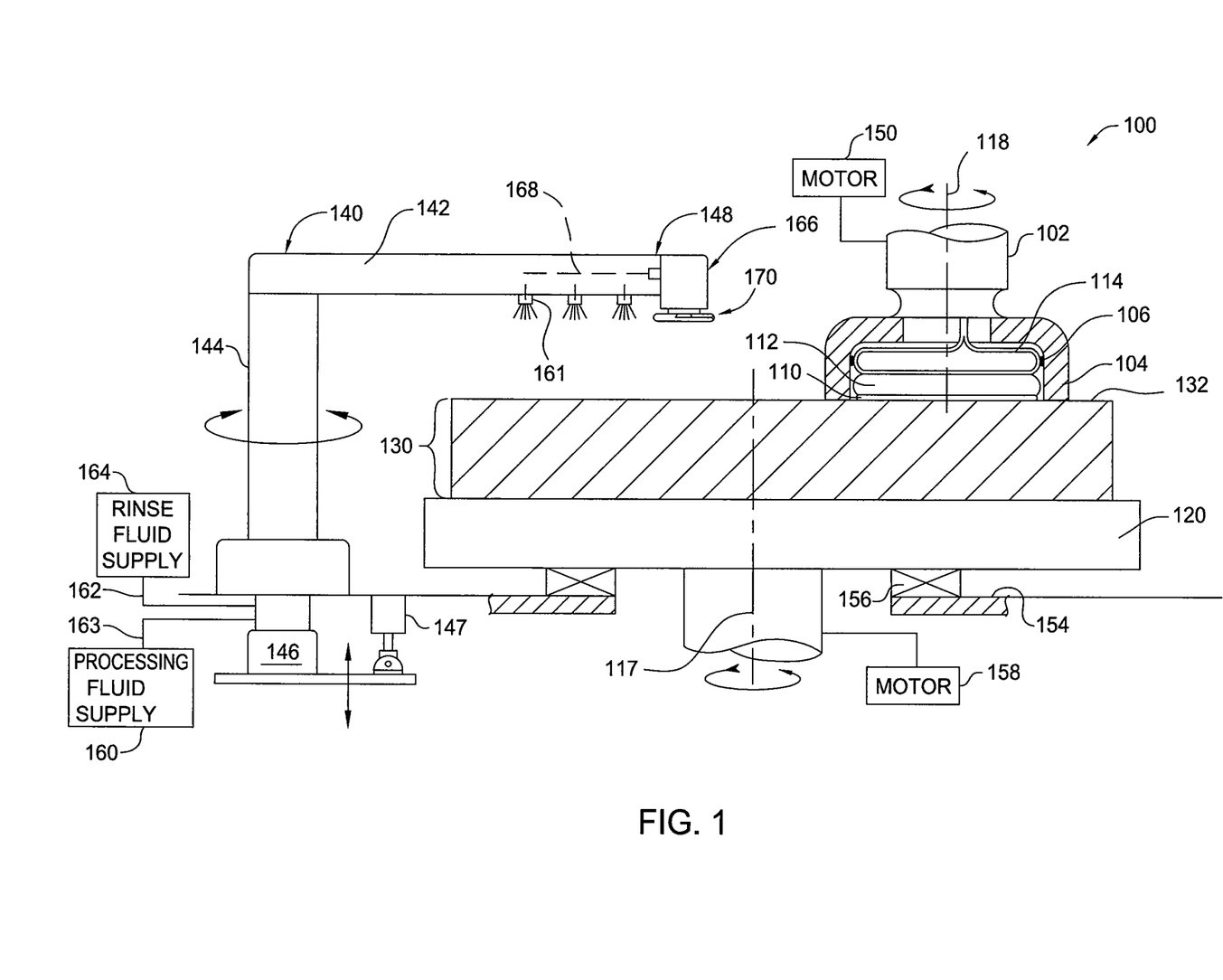
FIG. 1 is a schematic sectional view of one embodiment of a polishing station for performing the embodiments described herein.

FIG. 1 is a partial sectional view of one embodiment of a polishing station 100 that may be used to practice the embodiments described herein. The polishing station 100 includes a carrier head assembly 102 and a platen assembly 120. A substrate 110 is disposed in the carrier head assembly 102 during polishing. The carrier head assembly 102 generally retains the substrate 110 against a polishing pad assembly 130 having a polishing surface 132 disposed on the platen assembly 120. At least one of a carrier head assembly 102 or platen assembly 120 is rotated or otherwise moved to provide relative motion between the substrate 110 and the polishing pad assembly 130. In the embodiment depicted in FIG. 1, the carrier head assembly 102 is coupled to an actuator or motor 150 that provides at least rotational motion to the substrate 110 about an axis 118. The motor 150 may also oscillate the carrier head assembly 102, such that the substrate 110 is moved laterally back and forth across the surface 132 of the polishing pad assembly 130.

The polishing pad assembly 130 may comprise a conventional material such as a foamed polymer disposed on the platen assembly 120 as a pad. In one embodiment, the conventional polishing material is foamed polyurethane. In one embodiment, the pad is an IC1010 polyurethane pad, available from Rodel Inc., of Newark, Del. IC1010 polyurethane pads typically have a thickness of about 2.05 mm and a compressibility of about 2%. Other pads that can be used include IC1000 pads with and without an additional compressible bottom layer underneath the IC1000 pad, IC1010 pads with an additional compressible bottom layer underneath the IC1010 pad, and polishing pads available from other manufacturers. The solutions described herein are placed on the pad to contribute to the chemical mechanical polishing of a substrate.

In one embodiment, the carrier head assembly 102 includes a carrier head body 104 defining a substrate receiving pocket. The substrate receiving pocket allows the substrate 110 to be disposed therein. In certain embodiments, a membrane 114 is disposed in the substrate receiving pocket and may be evacuated to chuck the substrate 110 to the carrier head assembly 102, and pressurized to control the downward force of the substrate 110 when pressed against the polishing pad assembly 130. In certain embodiments, the substrate 110 and a second substrate 112 are disposed in the carrier head assembly 102 during polishing. The membrane 114 is circumferentially encompassed by support ring 106. In one embodiment, the carrier head may be a multi-zone carrier head. One suitable carrier head assembly 102 is a TITAN HEAD™ carrier head available from Applied Materials, Inc., located in Santa Clara, Calif.

The platen assembly 120 is supported on a base 154 by bearings 156 that facilitate rotation of the platen assembly 120 about an axis 117. A motor 158 is coupled to the platen assembly 120 and rotates the platen assembly 120 such that the polishing pad assembly 130 is moved relative to the carrier head assembly 102.

The combined slurry/rinse arm assembly or fluid delivery arm assembly 140 is utilized to deliver slurry from a processing fluid or slurry supply 160 through tube 163 to a surface 132 of the polishing pad assembly 130. In an alternative embodiment, the rinse fluid and the processing fluid may be provided to the polishing pad assembly 130 through separate delivery arm assemblies. In the embodiment depicted in FIG. 1, the fluid delivery arm assembly 140 includes an arm 142 extending from a stanchion 144. A motor 146 is provided to control the rotation of the arm 142 about a center line of the stanchion 144. An adjustment mechanism 147 may be provided to control the elevation of a distal end 148 of the arm 142 relative to the working surface of the polishing pad assembly 130. The adjustment mechanism 147 may be an actuator coupled to at least one of the arm 142 or the stanchion 144 for controlling the elevation of the distal end 148 of the arm 142 relative to the platen assembly 120.

The fluid delivery arm assembly 140 may include a plurality of rinse outlet ports 161 arranged to uniformly deliver a spray and/or stream of rinsing fluid to the surface of the polishing pad assembly 130. The ports 161 are coupled by a tube 162 routed through the fluid delivery arm assembly 140 to a rinsing fluid supply 164. In one embodiment, the fluid delivery arm assembly 140 may have between 12 and 15 ports. The rinsing fluid supply 164 provides a rinsing fluid to the polishing pad assembly 130 before, during, and/or after polishing the phase change alloy containing substrate and/or after the substrate 110 is removed to clean the polishing pad assembly 130. The polishing pad assembly 130 may also be cleaned using fluid from the ports 161 after conditioning the pad using a conditioning element, such as a diamond disk or brush (not shown). The polishing station 100 can also include a pad conditioner apparatus (not shown) to maintain the condition of the polishing pad assembly 130 so that it will effectively polish the substrate 110. The pad conditioner may be coupled to the arm 142, or may be coupled to a separate arm (not shown).

The nozzle assembly 166 is disposed at the distal end of the arm 142. The nozzle assembly 166 is coupled to the processing fluid supply 160 by a tube 168 routed through the fluid delivery arm assembly 140. The processing fluid supply may be a polishing slurry or polishing abrasive. The nozzle assembly 166 includes a nozzle 170 that may be selectively adjusted relative to the arm, such that the fluid exiting the nozzle 170 may be selectively directed to a specific area of the polishing pad assembly 130.

In one embodiment, the nozzle 170 is configured to generate a spray of slurry. In another embodiment, the nozzle 170 is adapted to provide a stream of slurry. In another embodiment, the nozzle 170 is configured to provide a stream and/or spray of slurry at a rate between about 200 to about 500 ml/minute, for example, about 300 ml/min) to the polishing surface.

In the embodiment depicted in FIG. 1, the substrate 110 may be a substrate used in through-silicon via applications. The substrate 110 typically has a thickness of about 100 microns or less of conductive material. Because the substrate is thin and flexible, the substrate 110 may be coupled to a second substrate 112 for support. The second substrate may 112 have a thickness of about 700-800 microns typically. If a device feature is formed on a surface of the substrate 110, then the substrate 110 and the second substrate are coupled together such that the device feature is positioned between the two substrates, e.g., the surface of the substrate 110 having the device feature formed thereon is oriented towards the second substrate. Orienting the substrate in this manner protects the device feature formed on the substrate 110 during subsequent processes.

When coupling the first substrate 110 and the second substrate 112, the two substrates may be fixedly coupled by epoxy, or any other suitable material that does not have an adverse effect on the substrates. The second substrate 112 is generally a glass dummy substrate or a sacrificial substrate. After coupling the first substrate 110 and the second substrate 112, but prior to chemical mechanical polishing the first substrate 110, a portion of the first substrate 110 may be removed. The thickness of the first substrate 110 may be reduced using mechanical grinding, or etching. The reduced thickness of the first substrate 110 allows for use in TSV and stacked chip applications. Generally, the first substrate has an initial thickness approximately equal to the second substrate prior to the reduction in thickness. The process used for reducing the thickness of the first substrate 110 typically leaves a rough surface on the backside of the first substrate. To reduce the surface roughness on the backside of the first substrate 110, chemical mechanical polishing may be used. The reduced thickness of the first substrate 110 leaves the substrate flexible and fragile. Therefore, the first substrate 110 is coupled to a second substrate 112 as an additional means of support during grinding and polishing of the first substrate 110.

Polishing Process and Polishing Solutions

Figure 2:
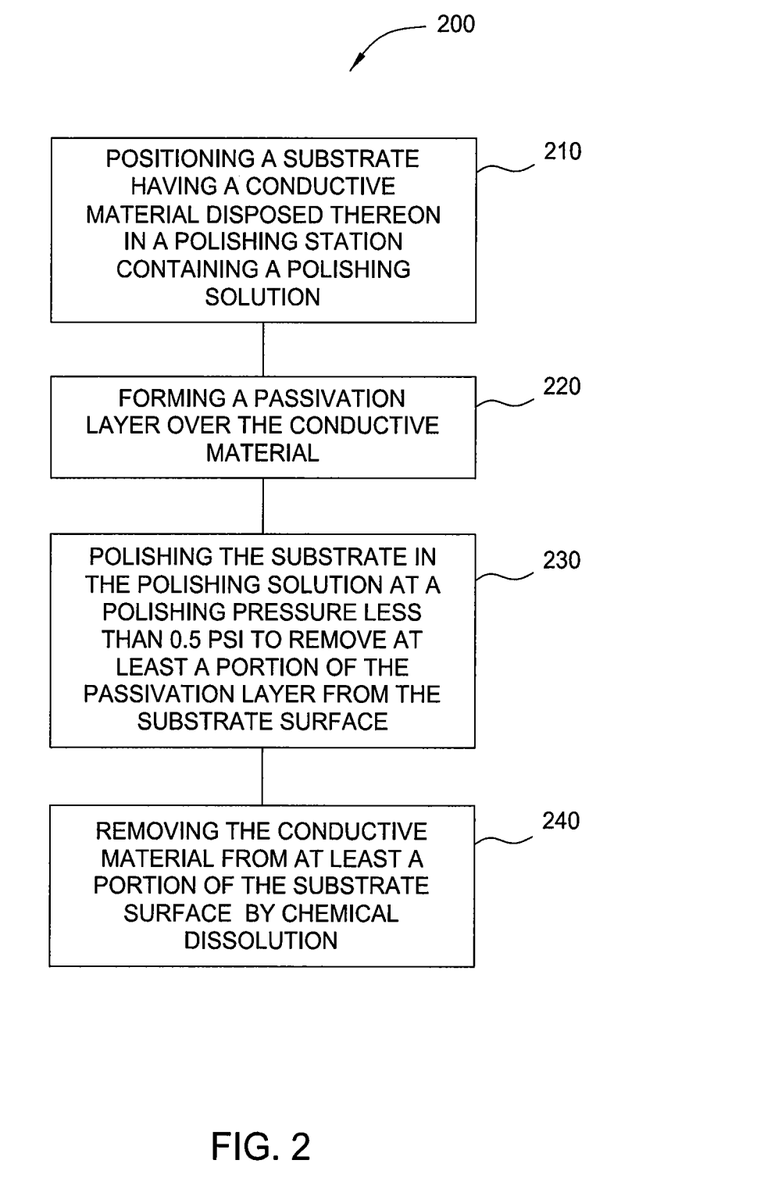
FIG. 2 is a flow chart illustrating one embodiment of a polishing process according to embodiments described herein.

FIG. 2 is a flow chart illustrating one embodiment of a polishing process 200 according to embodiments described herein. FIGS. 3A-3E are schematic diagrams of one embodiment of a substrate during a polishing process according to embodiments described herein. In block 210, a substrate 300 having a series of feature definitions or vias 304A, 304B and a series of field areas 305A, 305B, and 305C with a conductive material 310 disposed thereon is positioned in a polishing station, similar to polishing station 100, containing a polishing solution. In the embodiment depicted in FIG. 2, vias 304A, 304B constitute narrow feature definitions and field areas 305A, 305B, and 305C constitute wide feature definitions.

In embodiments where the polishing process is part of TSV formation, the substrate may be a silicon substrate. In certain embodiments, where the substrate 300 comprises a dielectric material, the dielectric material may comprise one or more dielectric materials conventionally employed in the manufacture of semiconductor devices. For example, dielectric materials may include materials such as silicon dioxide, phosphorus-doped silicon glass (PSG), boron-phosphorus-doped silicon glass (BPSG), and silicon dioxide derived from tetraethyl orthosilicate (TEOS) or silane by plasma enhanced chemical vapor deposition (PECVD). The dielectric layer may also comprise low dielectric constant materials, including fluoro-silicon glass (FSG), polymers, such as polyamides, carbon-containing silicon oxides, such as BLACK DIAMOND® dielectric material, silicon carbide materials, which may be doped with nitrogen and/or oxygen, including BLOk® dielectric materials, available from Applied Materials, Inc. of Santa Clara, Calif.

Figure 3A:
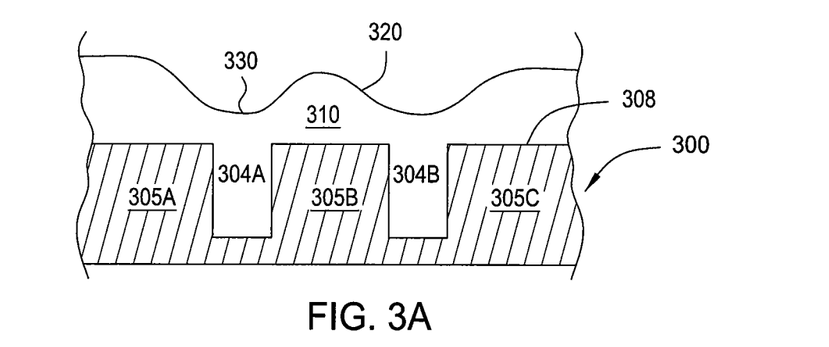
FIGS. 3A-3E are schematic diagrams of one embodiment of a substrate during a polishing process according to embodiments described herein.

The conductive material layer 310 is disposed on the substrate 300. While not shown, a seed layer of a conductive material may be deposited on the substrate prior to the deposition of the conductive material layer 310 to improve interlayer adhesion and improve subsequent deposition processes. The seed layer may be of the same material as the subsequent material to be deposited. In certain embodiments, it may be desirable to deposit a barrier layer over the substrate 300 prior to deposition of the seed layer and/or conductive material layer 310.

One type of conductive material layer 310 comprises copper containing materials. Copper containing materials include copper, copper alloys (e.g., copper-based alloys containing at least about 80 weight percent copper) or doped copper. As used throughout this disclosure, the phrase "copper containing material," the word "copper," and the symbol "Cu" are intended to encompass copper, copper alloys, doped copper, and combinations thereof.

As shown in FIG. 3A, the vias 304A, 304B are filled with an excess amount of conductive material 310, for example, copper. The deposition profile of the excess material includes areas of high overburden 320, also referred to as a hill or peak, formed over the substrate 300 with areas of minimal or low overburden 330, also referred to as a valley, formed over the vias.

Figure 3B:
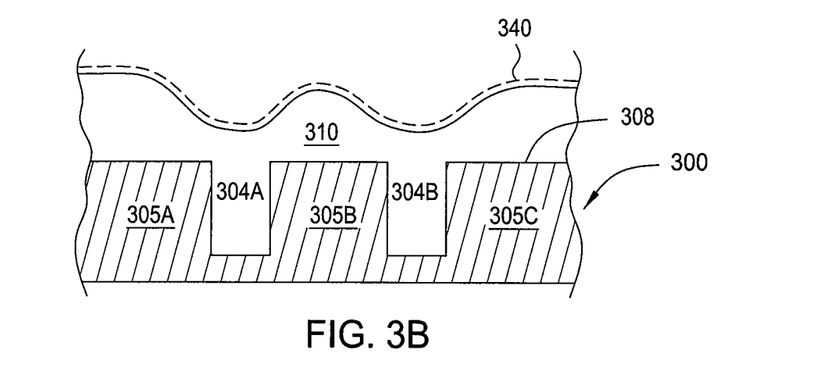
Figure 3C:
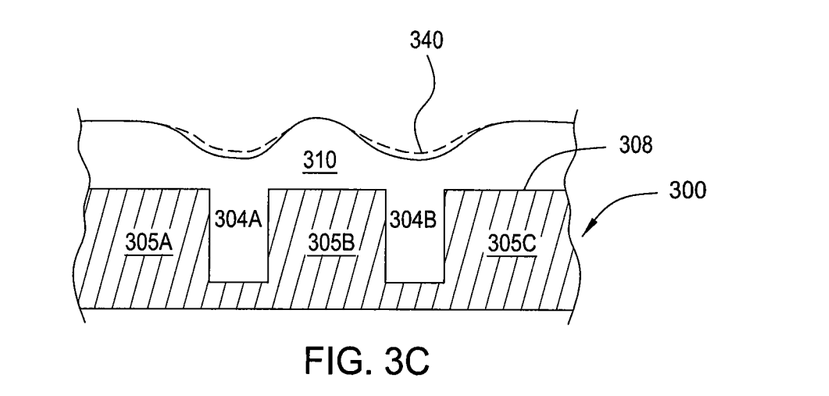

At block 220, as shown in FIG. 3B, the substrate 300 is exposed to a polishing solution described herein that forms a passivation layer 340 on the conductive material layer 310. The passivation layer 340 forms on the exposed conductive material 310 on a surface 308 of the substrate 300 including the high overburden 320, peaks, and minimal overburden 330, valleys, formed in the deposited conductive material 310. The passivation layer 340 chemically and/or electrically insulates the surface of the substrate from chemical reactions. The passivation layer 340 is formed from the exposure of the surface 308 of the substrate 300 to the corrosion inhibitor and/or other materials capable of forming a passivating or insulating film, for example, chelating agents. The thickness and density of the passivation layer 340 can dictate the extent of chemical reactions and/or amount of chemical dissolution. For example, a thicker or denser passivation layer 340 has been observed to result in less chemical dissolution compared to thinner and less dense passivation layers. Thus, control of the composition of passivating agents, corrosion inhibitors and/or chelating agents, allow control of the removal rate and amount of material removed from the surface 308 of the substrate 310. For example, in embodiments where a less dense passivation layer is present, the passivation layer may be easily broken down by very minor chemical abrasion, such as from the relative motion of the pad and the surface of the substrate and/or abrasive in the slurry. As shown in FIG. 3C, the passivation layer 340 over the substrate 300 is depassivated by abrasion first until its surface is planarized to the same level as the surface 308 of substrate 300.

In one embodiment, the polishing solution is an abrasive-free solution comprising an acid, a chelating agent, a corrosion inhibitor, a surfactant, and an oxidizer. In another embodiment, the polishing solution is an abrasive containing solution comprising an acid, a chelating agent, a corrosion inhibitor, an oxidizer, and an abrasive. It is believed that the polishing solutions described herein improve the effective removal rate of materials from the surface of the substrate, such as copper, during CMP, with a reduction in planarization type defects and yielding a smoother substrate surface.

Although the polishing solutions are particularly useful for removing copper, it is believed that the polishing solution may be used form the removal of other conductive materials such as aluminum, platinum, tungsten, titanium, titanium nitride, tantalum, tantalum nitride, cobalt, gold, silver, ruthenium and combinations thereof.

The polishing solution includes an acid for driving the chemical dissolution reaction. Suitable acids include, for example, sulfuric acid, phosphoric acid, perchloric acid, nitric acid, acetic acid, and combinations thereof. The acid may also buffer the solution to maintain a desired pH level for processing a substrate.

Examples of suitable acids include compounds having a phosphate group ($PO_4^{3-}$), such as, phosphoric acid, potassium phosphate ($K_xPO_4$) (x=1, 2, 3), copper phosphate, ammonium dihydrogen phosphate (($NH_4$)$_2H_2PO_4$), diammonium hydrogen phosphate (($NH_4$)$HPO_4$), and compounds having a sulfate group ($SO_4^{2-}$), such as sulfuric acid ($H_2SO_4$), ammonium hydrogen sulfate ($NH_4HSO_4$), ammonium sulfate, potassium sulfate, copper sulfate, nitric acid, or combinations thereof.

In one embodiment, the polishing solution contains an acidic component that can take up about 1 to about 10 percent by weight (wt. %) or volume (vol %) of the total solution to drive the chemical dissolution reaction. In another embodiment, the polishing solution contains an acidic component that can take up about 2 to about 5 percent by weight (wt. %) or volume (vol %) of the total solution for driving the chemical dissolution reaction.

One aspect or component of the polishing solution is the use of one or more chelating agents to complex with the surface of the substrate to enhance the chemical dissolution process. In any of the embodiments described herein, the chelating agents can bind to a conductive material, such as copper ions, increase the removal rate of metal materials and/or improve dissolution uniformity across the substrate surface. The metal materials for removal, such as copper, may be in any oxidation state, such as 0, 1, or 2, before, during or after ligating with a functional group. The functional groups can bind the metal materials created on the substrate surface during processing and remove the metal materials from the substrate surface. The chelating agents may also be used to buffer the polishing solution to maintain a desired pH level for processing a substrate. The chelating agents may also form or enhance the formation of a passivation layer on the substrate surface.

In one embodiment the one or more chelating agents comprise chelating agents having a carboxylate functional group and/or chelating agents having an amine or amide functional group. The chelating agent having a carboxylate functional group include compounds having one or more functional groups selected from the group of carboxylate functional groups, dicarboxylate functional groups, tricarboxylate functional groups, a mixture of hydroxyl and carboxylate functional groups, or combinations thereof. The one or more chelating agents may also include salts of the chelating agents described herein, for example, ammonia and potassium salts thereof. In one embodiment, the one or more chelating agents may be in the solution at a concentration between about 0.4 wt. % and about 2.5 wt. %, such as between about 1 wt. % and about 2 wt. % of the solution.

Examples of suitable chelating agents having one or more carboxylate functional groups include citric acid, tartaric acid, succinic acid, oxalic acid, amino acids, salts thereof, or combinations thereof. For example, suitable salts for the chelating agent may include ammonium citrate, potassium citrate, ammonium succinate, potassium succinate, ammonium oxalate, potassium oxalate, potassium tartrate, or combinations thereof. The salts may have multi-basic states, for example, citrates have mono-, di- and tri-basic states. Other suitable chelating agents having one or more carboxylate functional groups include adipic acid, butyric acid, capric acid, caproic acid, caprylic acid, glutaric acid, glycolic acid, formic acid, fumaric acid, lactic acid, lauric acid, malic acid, maleic acid, malonic acid, myristic acid, palmitic acid, phthalic acid, propionic acid, pyruvic acid, stearic acid, valeric acid, derivatives thereof, salts thereof or combinations thereof. In certain embodiments, the chelating agents may be free of an amine or amide functional groups.

In another embodiment, where the one or more chelating agents comprise a chelating agent having an amine or amide functional group, the one or more chelating agents can include compounds such as ethylenediamine (EDA), diethylenetriamine, diethylenetriamine derivatives, hexadiamine, amino acids such as glycine, methylformamide, imidodiacetic acid, derivatives thereof, salts thereof or combinations thereof. In one embodiment, the one or more chelating agents may be in the solution at a concentration between about 0.4 wt. % and about 2.5 wt. %, such as between about 1 wt. % and about 2 wt. % of the solution.

Another aspect or component of the polishing solution is the use of one or more corrosion inhibitors. The corrosion inhibitors can be added to reduce the oxidation or corrosion of metal surfaces by forming a passivation layer that minimizes the chemical interaction between the substrate surface and the surrounding polishing solution. The passivation layer of material formed by the corrosion inhibitors thus tends to suppress or minimize the chemical dissolution of conductive material from the substrate surface.

Examples of suitable corrosion inhibitors include corrosion inhibitors having an azole group. Examples of organic compounds having azole groups include benzotriazole (BTA), mercaptobenzotriazole, 5-methyl-1-benzotriazole (TTA), tolyltriazole (TTA), derivatives thereof or combinations thereof. Other suitable compounds include 1,2,4triazole, benzoylimidazole (BIA), benzimidazole, derivatives thereof or combinations thereof. In one embodiment, the one or more corrosion inhibitors may be in the solution at a concentration between about 0.01 wt. % and about 1.0 wt. %, such as between about 0.02 wt. % and about 0.05 wt. % of the total solution.

Another aspect or component of the polishing solution includes one or more oxidizers. Examples of suitable oxidizers include hydrogen peroxide, ferric nitrate, an iodate, and ammoniumpersulphate (APS). In one embodiment, the one or more oxidizers can be present at a concentration between about 0.1 wt. % and about 5 wt. %, such as between about 0.5 wt. % and about 3.0 wt. %. In another embodiment, the one or more oxidizers can be present at a concentration between about 0.1 vol. % and about 5 vol. %, such as between about 0.5 vol. % and about 3.0 vol. % of the total solution In embodiments where the polishing solution is an abrasive-free polishing solution, the polishing solution may further comprise one or more surfactants. Surfactants may be used to increase the dissolution or solubility of materials, such as metals and metal ions or by-products produced during processing, and improve chemical stability and reduce decomposition of components of the polishing solution. In one embodiment, the one or more surfactants can comprise a concentration between about 1% and about 30% by volume or weight of the polishing solution. In another embodiment, the one or more surfactants can comprise a concentration between about 5% and about 20% by volume or weight of the polishing solution.

The one or more surfactants may include non-ionic surfactants as well as ionic surfactants including anionic surfactants, cationic surfactants, amphoteric surfactants, and ionic surfactants having more than one ionic functional group, such as Zweitter-ionic surfactants.

Another aspect or component of the polishing solution may comprise conventional abrasive particles, such as silica or modified silica with a particle size from between about 5 nm to about 100 nm.

The balance or remainder of the polishing solutions described herein is a solvent, such as a polar solvent, including water, such as deionized water. Other solvents may be used solely or in combination with water, such as organic solvents. Organic solvents include alcohols, such as isopropyl alcohol or glycols, ethers, such as diethyl ether, furans, such as tetrahydrofuran, hydrocarbons, such as pentane or heptane, aromatic hydrocarbons, such as benzene or toluene, halogenated solvents, such as methylene chloride or carbon tetrachloride, derivatives, thereof or combinations thereof.

The solutions herein may have a pH between about 2.0 and about 7.0, such as between about 3.0 to about 7.0, for example between about 4.0 to about 5.5.

In certain embodiments, the substrate 300 is positioned in a face-up orientation and the polishing solution is delivered onto the top surface of the substrate 300. In certain embodiments, the substrate 300 is positioned in a face-down orientation and immersed in the polishing solution.

At block 230, the substrate 300 is polished in the polishing solution at a polishing pressure less than 0.5 pounds per square inch ($lb/in^2$ or psi) (13.98 kPa) to remove at least a portion of the passivation layer 340 as shown in FIG. 3C. A portion of the conductive layer 310 underlying the portion of the passivation layer 340 may also be removed. The polishing pressure may be applied by the carrier head assembly to the substrate 300. In one embodiment, removal of at least a portion of the passivation layer 340 may be performed by applying a polishing pressure of about 0.3 psi (2.0 kPa) or less, for example, from about 0.005 psi (34.5 Pa) to about 0.01 psi (68.9 Pa). In one embodiment a polishing pressure of about 0.05 psi (34.5 Pa) or less is applied. In one embodiment, a polishing pressure from about 0 to about 0.02 psi (0.14 kPa) is applied. In one embodiment, the polishing process is a pressure-free process where no polishing pressure is applied by the carrier head assembly to the substrate 300.

During removal of the passivation layer 340, the platen assembly 120 may be rotated at a velocity from about 10 rpm (rotations per minute) to about 50 rpm, and the carrier head assembly 102 may be rotated at a velocity from about 50 rpm to about 90 rpm and also moved linearly at a velocity from about 20 cm/s (centimeters per second) to about 160 cm/s in a direction radial to the basin. In one embodiment, the carrier head assembly 102 may be moved linearly at a velocity from about 21.2 cm/s to about 106.3 cm/s. The preferred ranges for a 300 mm diameter substrate are a platen assembly 120 rotational velocity from about 25 rpm to about 35 rpm and a carrier head assembly 102 rotational velocity from about 55 rpm to about 75 rpm and a linear (e.g., radial) velocity of about 160 cm/s. In one embodiment the platen assembly 120 has a diameter between about 18 inches (45.7 cm) and about 32 inches (81.3 cm). The carrier head assembly may move along the radius of the platen assembly 120 for a distance between about 6 inches (15.2 cm) and about 8 inches (20.3 cm).

The low polishing pressures used herein reduce or minimize damaging shear forces and frictional forces for substrates containing low k dielectric materials. Reduced or minimized forces can result in reduced or minimal deformations and defect formation of features from polishing. Further, the lower shear forces and frictional forces have been observed to reduce or minimize formation of topographical defects, such as dishing and scratches, and delamination, during polishing. A region of non-passivated conductive material may be exposed and removed by chemical dissolution after mechanical abrasion disturbs or removes the passivation layer on the surface of the substrate.

Figure 3D:
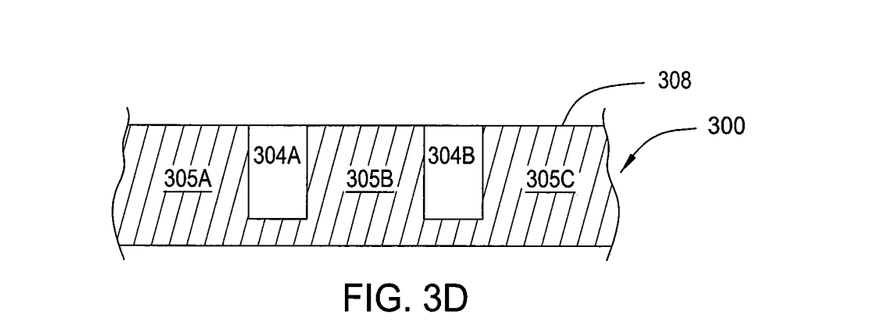

At block 240, the conductive material 310 is removed from at least a portion of the surface 308 of the substrate 310 by chemical dissolution as shown in FIG. 3D. The polishing process of block 240 may be a pressure-free process where no polishing pressure is applied by the carrier head assembly to the substrate 300 and removal of the conductive material 310 from non-passivated areas occurs by chemical dissolution. The polishing process of block 240 may be similar to the polishing process of block 230 where a polishing pressure of less than 0.5 pounds per square inch (lb/in$^2$ or psi) (13.98 kPa) is applied to remove at least a portion of the conductive layer 310. In one embodiment, removal of at least a portion of the conductive layer 310 may be performed by applying a polishing pressure of about 0.3 psi (2.0 kPa) or less, for example, from about 0.005 psi (34.5 Pa) to about 0.01 psi (68.9 Pa). In one embodiment a polishing pressure of about 0.05 psi (34.5 Pa) or less is applied. In one embodiment, a polishing pressure from about 0 to about 0.02 psi (0.14 kPa) is applied.

During the polishing process of block 240, the platen assembly 120 may be rotated at a velocity from about 10 rpm (rotations per minute) to about 50 rpm, and the carrier head assembly 102 may be rotated at a velocity from about 50 rpm to about 90 rpm and also moved linearly at a velocity from about 20 cm/s (centimeters per second) to about 160 cm/s in a direction radial to the basin. In one embodiment, the carrier head assembly 102 may be moved linearly at a velocity from about 21.2 cm/s to about 106.3 cm/s. The preferred ranges for a 300 mm diameter substrate are a platen assembly 120 rotational velocity from about 25 rpm to about 35 rpm and a carrier head assembly 102 rotational velocity from about 55 rpm to about 75 rpm and a linear (e.g., radial) velocity of about 160 cm/s. The carrier head assembly may move along the radius of the platen assembly 120 for a distance between about 6 inches (15.2 cm) and about 8 inches (20.3 cm).

The polishing process of block 230 and block 240 may be performed at the same or similar polishing conditions (e.g., pressure, rotation, linear velocity, etc.). The polishing process of block 230 and block 240 may be performed using different polishing conditions. For example, the polishing process of block 230 may occur at a low polishing pressure (e.g., below 0.5 psi) to remove a portion of the passivation layer and the polishing process of block 240 may be a no pressure process where removal of the conductive material occurs by chemical dissolution and relative motion between the substrate and the polishing pad.

A removal rate of conductive material of up to about 10,000 Å/min can be achieved by the processes described herein. Higher removal rates are generally desirable, but due to the goal of maximizing process uniformity and other process variables (e.g., reaction kinetics) it is common for the chemical dissolution rates to be controlled from about 100 Å/min to about 15,000 Å/min. The substrate is typically exposed to the polishing solution for a period of time sufficient to remove at least a portion or all of the desired material disposed thereon.

The removal rate of conductive material may be tuned by modifying the components of the polishing solution. For example, the removal rate may be modified by increasing at least one of the following: increasing the concentration of the chelating agent and lowering the pH of the polishing solution (e.g., making the polishing solution more acidic).

Figure 3E:
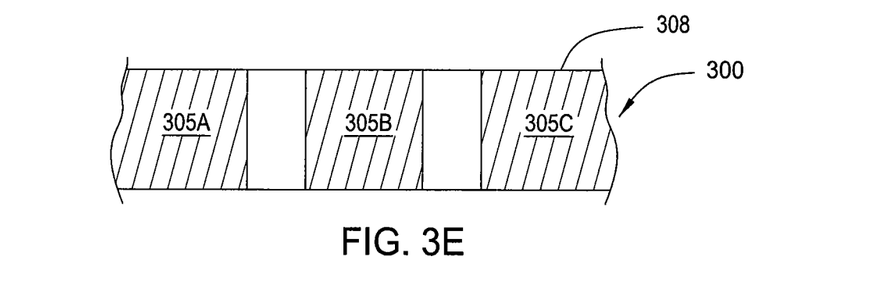

In embodiments where a TSV structure is formed, the substrate may be subject to a thinning process (e.g., chemical mechanical polishing or chemical or plasma etch) until the conductive metal of the vias extends all the way through the substrate 300 as shown in FIG. 3E.

Figure 4:
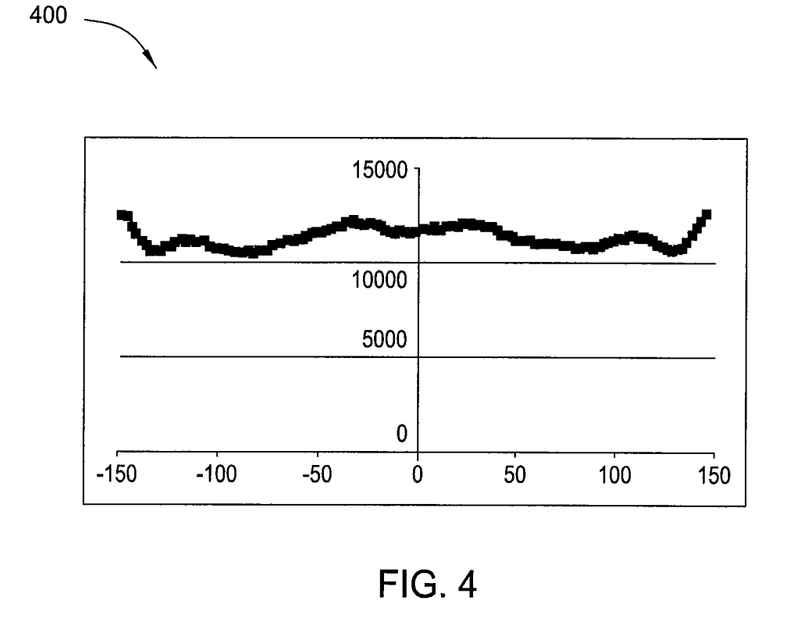
FIG. 4 is a plot illustrating one example of the removal rate of copper for a polishing process performed according to embodiments described herein.

FIG. 4 is a plot 400 illustrating the removal rate of copper for a polishing process performed according to embodiments described herein. The x-axis depicts the diameter of the substrate (mm) and the y-axis depicts the topography or the height of the conductive material (Å). The polishing process was performed using the parameters described in Table I and the abrasive polishing solution described herein where the polishing solution contained less than 0.25% abrasive (SiO$_2$ colloidal with 100 nm particles) by weight of the total polishing solution. Under these conditions, the Cu removal rate was about 1 micron/min as shown in FIG. 4, which is higher than the removal rate of most commercial slurries.

Figure 5:
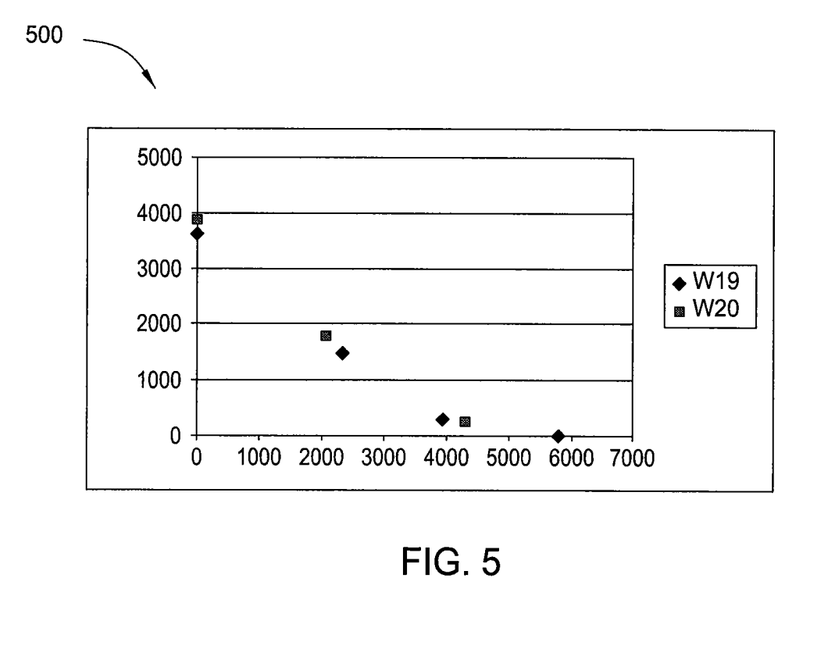
FIG. 5 is a plot illustrating planarization efficiency for one example of a polishing process performed according to embodiments described herein.

FIG. 5 is a plot 500 illustrating planarization efficiency for two different substrates, W19 and W20, polished using a polishing process performed according to embodiments described herein. The x-axis depicts the amount of copper material removed (Å) and the y-axis depicts the amount of copper dishing. For example, when the amount of copper material removed is zero, the amount of dishing is at its highest point between 3,500 Å and 4,000 Å. As shown in FIG. 5, as the amount of copper removed increases, the level of dishing is correspondingly reduced. The planarization efficiency (PE), defined as the ratio of dishing reduction/removal thickness, is in a range between 60% and 90%.

EXAMPLE

The following non-limiting examples are provided to further illustrate embodiments described herein. However, the examples are not intended to be all inclusive and are not intended to limit the scope of the embodiments described herein.

Example 1

A copper plated silicon substrate with 300 mm diameter was polished and planarized using the following polishing composition within a modified cell on a REFLEXION® LK CMP system, available from Applied Materials, Inc. of Santa Clara, Calif. A substrate having a copper layer of about 8,000 Å thick on the substrate surface with a step height of about 3,900 Å was placed onto a platen assembly and exposed to an abrasive containing polishing solution of:

about 4% by volume phosphoric acid to provide a pH of about 3.5;
    about 2% by volume ammonium citrate;
    about 0.03% by weight benzotriazole;
    about 1.0% by volume of hydrogen peroxide;
    about 0.25% by weight of silica ($SiO_2$) abrasive particles; and
    de-ionized water.

An IC 1010 polishing pad was contacted with the substrate at about 0.2 psi. The substrate was polished and examined. The excess copper layer formerly on the substrate surface was removed to leave behind a silicon surface having copper filled vias.

Example 2

A copper plated silicon substrate with 300 mm diameter was polished and planarized using the following polishing composition within a modified cell on a REFLEXION® LK CMP system, available from Applied Materials, Inc. of Santa Clara, Calif. A substrate having a copper layer of about 8,000 Å thick on the substrate surface with a step height of about 3,900 Å was placed onto a platen assembly and exposed to an abrasive-free polishing solution of:

about 4% by volume phosphoric acid to provide a pH of about 3.5;
    about 2% by volume ammonium citrate;
    about 0.03% by weight benzotriazole;
    about 0.5% of a surfactant;
    about 2.0% by volume of hydrogen peroxide; and
    de-ionized water.

An IC 1010 polishing pad was contacted with the substrate at about 0.1 psi. The substrate was polished and examined. The excess copper layer formerly on the substrate surface was removed to leave behind a silicon surface having copper filled vias.

While the foregoing is directed to embodiments of the present invention, other and further embodiments of the invention may be devised without departing from the basic scope thereof, and the scope thereof is determined by the claims that follow.

The invention claimed is:

1. A method of chemical mechanical polishing (CMP) of a substrate, comprising:
    exposing a substrate having a plurality of vias filled with an excess conductive material in a face-up orientation to a polishing solution, wherein the excess of conductive material has a deposition profile including areas of high overburden and areas of low overburden, the polishing solution comprising:
        phosphoric acid;
        one or more chelating agents;
        one or more corrosion inhibitors; and
        one or more oxidizers;
    forming a passivation layer on the conductive material;
    providing relative motion between the substrate and the polishing pad to remove the passivation layer from the areas of high overburden of the conductive material to expose portions of the conductive material while the passivation layer remains over the areas of low overburden; and
    removing conductive material from the exposed portions of the conductive material without the application of electrochemical activity while applying a pressure between the substrate and the polishing pad by use of a carrier head assembly, wherein the pressure is less than 0.5 psi.

2. The method of claim 1, wherein the pressure is from about 0 to about 0.02 psi.

3. The method of claim 1, wherein the substrate is a silicon substrate and the conductive material is a copper containing material.

4. The method of claim 1, wherein the polishing solution is an abrasive-free polishing solution and further comprises one or more surfactants to increase the dissolution of the conductive material during processing and reduce decomposition of components of the polishing solution.

5. The method of claim 1, wherein the providing relative motion comprises:
    rotating the substrate at a velocity from about 10 revolutions per minute (rpm) to about 50 rpm;
    rotating the carrier head assembly at a velocity from about 50 rpm to about 90 rpm; and
    moving the carrier head assembly linearly at a velocity from about 20 cm/s to about 160 cm/s.

6. The method of claim 1, wherein the one or more chelating agents is selected from the group consisting of: ammonium citrate, potassium citrate, ammonium succinate, potassium succinate, ammonium oxalate, potassium oxalate, potassium tartrate, glycine and combinations thereof.

7. The method of claim 6, wherein the one or more corrosion inhibitors is selected from the group consisting of: benzotriazole (BTA), mercaptobenzotriazole, 5-methyl-1-benzotriazole (TTA), tolyltriazole (TTA), 1,2,4triazole, benzoylimidazole (BIA), benzimidazole, and combinations thereof.

8. The method of claim 7, wherein the one or more oxidizers is selected from the group consisting of: hydrogen peroxide, ammoniumpersulphate (APS), and combinations thereof.

\* \* \* \* \*